United States Patent

Sugizaki et al.

(10) Patent No.: US 9,041,104 B2
(45) Date of Patent: May 26, 2015

(54) SEMICONDUCTOR DEVICE

(75) Inventors: Emiko Sugizaki, Yokohama (JP);
Shigeru Kawanaka, Yokohama (JP);
Kanna Adachi, Chigasaki (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 299 days.

(21) Appl. No.: 13/358,643

(22) Filed: Jan. 26, 2012

(65) Prior Publication Data

US 2012/0228706 A1    Sep. 13, 2012

(30) Foreign Application Priority Data

Mar. 9, 2011    (JP) .................. 2011-051671

(51) Int. Cl.
*H01L 29/78*     (2006.01)
*H01L 29/739*    (2006.01)
*H01L 29/06*     (2006.01)
*H01L 29/423*    (2006.01)

(52) U.S. Cl.
CPC ........ *H01L 29/7391* (2013.01); *H01L 29/0657* (2013.01); *H01L 29/42312* (2013.01)

(58) Field of Classification Search
USPC .................................................. 257/345, 401
See application file for complete search history.

(56) References Cited

U.S. PATENT DOCUMENTS

2008/0290408 A1* 11/2008 Hsu et al. .................. 257/335
2010/0038713 A1*  2/2010 Majhi et al. ............... 257/344
2011/0042757 A1*  2/2011 Tan et al. ................... 257/402
2011/0147838 A1   6/2011 Gossner et al.
2011/0278542 A1* 11/2011 Bangsaruntip et al. ...... 257/24

OTHER PUBLICATIONS

U.S. Appl. No. 13/403,302, filed Feb. 23, 2012, Adachi.
U.S. Appl. No. 13/600,982, filed Aug. 31, 2012, Kondo, et al.
Office Action issued Jun. 25, 2013 in Japanese Patent Application No. 2011-051671 with English language translation.
Chenming Hu, et al., "Green Transistor—A $V_{DD}$ Scaling Path for Future Low Power ICs", VLSI-TSA, 2008, pp. 14-15.

* cited by examiner

*Primary Examiner* — David Vu
*Assistant Examiner* — Jonathan Han
(74) *Attorney, Agent, or Firm* — Oblon, McClelland, Maier & Neustadt, L.L.P.

(57) ABSTRACT

A memory includes a semiconductor layer, a gate insulating film on the semiconductor layer, and a gate electrode on the gate insulating film. A first channel region of a first conductivity type is provided on a surface of the semiconductor layer below the gate insulating film. A diffusion layer of a second conductivity type is provided below the first channel region in the semiconductor layer. The diffusion layer contacts a bottom of the first channel region in a direction substantially vertical to a surface of the semiconductor layer. The diffusion layer forms a PN junction with the bottom of the first channel region. A drain of a first conductivity type and a source of a second conductivity type are provided on a side and another side of the first channel region. A sidewall film covers a side surface of the first channel region on a side of the diffusion layer.

16 Claims, 11 Drawing Sheets

SEMICONDUCTOR DEVICE

CROSS REFERENCE TO RELATED APPLICATIONS

This application is based upon and claims the benefit of priority from the prior Japanese Patent Application No. 2011-051671, filed on Mar. 9, 2011, the entire contents of which are incorporated herein by reference.

FIELD

The embodiments of the present invention relate to a semiconductor device.

BACKGROUND

A tunnel field effect transistor (TFET) is a transistor that controls turning on and off of devices by using a tunnel current generated at a PN junction of a semiconductor or a Schottky junction between metal and a semiconductor.

Conventionally, the tunnel field effect transistor has had a problem that its on-current is less than that of the existing MOSFET (Metal-Oxide Semiconductor FET). To handle such a problem, a type of tunnel field effect transistor having a vertical PN junction in a channel region on a source side has been proposed. According to this vertical PN junction, a P-type semiconductor and an N-type semiconductor are adjacent to each other in a direction vertical to a surface of a semiconductor substrate (hereinafter, also "vertical direction").

However, according to the conventional tunnel field effect transistor with a vertical PN junction, a horizontal PN junction is also provided immediately below a gate electrode. In the horizontal PN junction, a P-type semiconductor and an N-type semiconductor are adjacent to each other in a horizontal direction with respect to the surface of a semiconductor substrate (hereinafter, also "horizontal direction"). Because the horizontal PN junction is provided immediately below the gate electrode, a gate voltage applies a larger electric field to the horizontal PN junction than to the vertical PN junction in this tunnel field effect transistor. Therefore, band-to-band tunneling at the horizontal PN junction occurs earlier than that at the vertical PN junction. Consequently, such a tunnel field effect transistor reduces its S-factor.

A conductivity type of a channel region on a drain side is the same as that of a drain diffusion layer. A conductivity type of the channel region on the source side is also the same as that of the drain diffusion layer. Therefore, when a drain voltage is applied, an electric field is applied to PN junctions and band-to-band tunneling occurs, so that an off-leakage current is increased.

Furthermore, when a drain voltage is applied, a reverse bias is applied between a source diffusion layer below the channel region on the source side and the drain diffusion layer, so that a junction leakage current is generated. As a result, the off-leakage current is further increased.

BRIEF DESCRIPTION OF THE DRAWINGS

FIGS. 2A to 9 are cross-sectional views of a manufacturing method of a tunnel field effect transistor according to the first embodiment;

DETAILED DESCRIPTION

A semiconductor storage device according to an embodiment comprises a semiconductor layer, a gate insulating film on the semiconductor layer, and a gate electrode on the gate insulating film. A first channel region of a first conductivity type is provided on a part of a surface of the semiconductor layer below the gate insulating film. A diffusion layer of a second conductivity type is provided further below the first channel region in the semiconductor layer. The diffusion layer contacts a bottom of the first channel region in a direction substantially vertical to a surface of the semiconductor layer. The diffusion layer forms a PN junction with the bottom of the first channel region. A drain of a first conductivity type is provided on a side of the first channel region in the semiconductor layer. A source of a second conductivity type is provided on another side of the first channel region in the semiconductor layer. A sidewall insulating film covers a side surface of the first channel region on a side of the diffusion layer.

Embodiments will now be explained with reference to the accompanying drawings. The present invention is not limited to the embodiments.

(First Embodiment)

Figure 1:
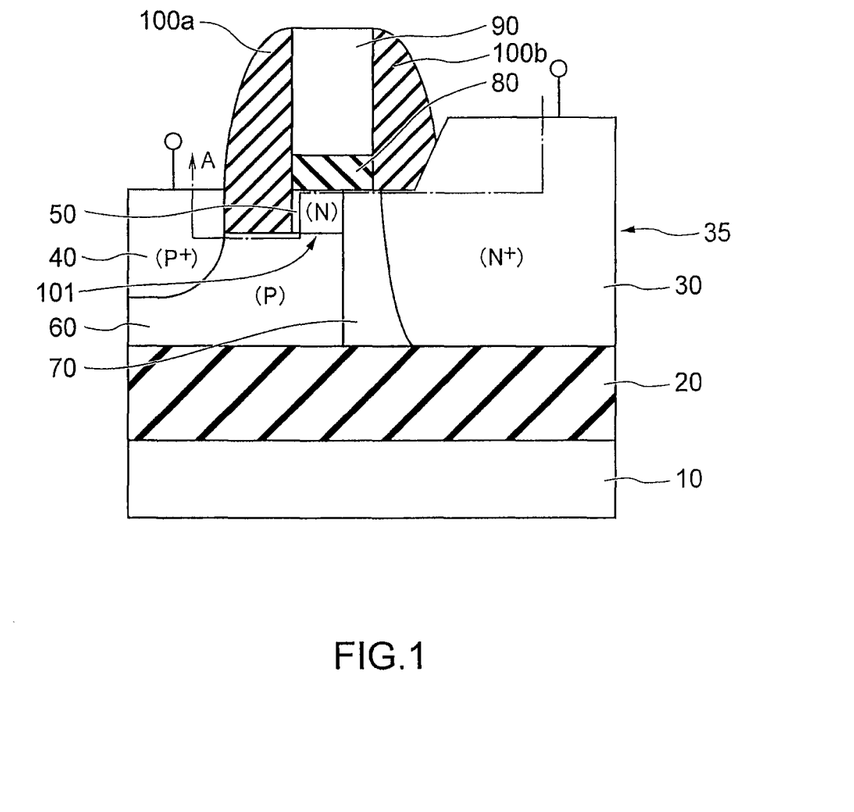
FIG. 1 is a cross-sectional view of a configuration of a tunnel field effect transistor according to a first embodiment.

FIG. 1 is a cross-sectional view of a configuration of a tunnel field effect transistor according to a first embodiment. The tunnel field effect transistor according to the first embodiment is formed on, for example, an SOI (Silicon On Insulator) or SON (Silicon On Nothing). FIG. 1 shows a tunnel field effect transistor formed on the SOI.

The tunnel field effect transistor according to the first embodiment includes a semiconductor substrate 10, a buried insulating film (hereinafter, also "BOX (Buried Oxide) layer") 20, a drain layer 30, a source layer 40, a pocket layer 50 serving as a first channel region, a second source layer 60 serving as a diffusion layer, an intrinsic region 70 serving as a second channel region, a gate insulating film 80, a gate electrode 90, and sidewall insulating films 100a and 100b.

The drain layer 30, the source layer 40, the pocket layer 50, the second source layer 60, and the intrinsic region 70 are formed in an SOI layer 35 serving as a semiconductor layer. The semiconductor substrate 10, the BOX layer 20, and the SOI layer 35 constitute an SOI substrate. The semiconductor substrate 10 is a silicon substrate, for example. The BOX layer 20 is formed of a silicon oxide film, for example. The SOI layer 35 is formed of a single crystal silicon, for example.

The gate insulating film 80 is provided on the SOI layer 35. The gate insulating film 80 is formed of, for example, a silicon oxide film or a high-k film whose dielectric constant is higher than that of the silicon oxide film.

The gate electrode 90 is provided on the gate insulating film 80. The gate electrode 90 is made of polysilicon or metal silicide, for example.

The sidewall insulating film 100a covers one side surface of the pocket layer 50, that of the gate insulating film 80, and that of the gate electrode 90. The sidewall insulating film 100b covers the other side surface of the gate insulating film 80 and that of the gate electrode 90.

A surface of the SOI layer 35 below the gate electrode 90 and the gate insulating film 80 functions as a channel region. The channel region includes the pocket layer 50 serving as the first channel region on a source side and the intrinsic region 70 serving as the second channel region on a drain side. The pocket layer 50 is formed of an N-type semiconductor, which is a first conductivity type. The intrinsic region 70 is an intrinsic semiconductor region that is provided between the pocket layer 50 and the drain layer 30 and between the second source layer 60 and the drain layer 30. The intrinsic region 70 has an impurity concentration equal to or less than $10^{18}$ cm$^{-3}$.

The second source layer 60 is formed of a P-type semiconductor, which is a second conductivity type, and is provided below the pocket layer 50 in the SOI layer 35. The pocket layer 50 contacts the second source layer 60 in a direction substantially vertical to the surface of the SOI layer 35 or the semiconductor substrate 10, so that a PN junction in a vertical direction (hereinafter, also "vertical PN junction") 101 is formed. A junction surface of the PN junction 101 faces the vertical direction (the upward direction in FIG. 1). That is, a surface of the second source layer 60 contacts a bottom surface of the pocket layer 50, so that the vertical PN junction 101 is formed. The second source layer 60 also contacts the source layer 40.

The drain layer 30 and the source layer 40 are provided respectively on one side and the other side of the pocket layer 50 and the intrinsic region 70 in the SOI layer 35. The drain layer 30 is an N+ type semiconductor layer and the source layer 40 is a P+ type semiconductor layer.

The sidewall insulating film 100a is interposed between a side surface of the pocket layer 50 on the source side and the source layer 40. With this configuration, the side surface of the pocket layer 50 on the source side contacts the sidewall insulating film 100a, but does not contact the P-type source layer 40 and the second source layer 60. That is, the pocket layer 50 contacts the second source layer 60 only at its bottom surface. Accordingly, any horizontal PN junction (a PN junction having a junction surface facing the horizontal direction) is not formed on the side surface of the pocket layer 50 and the vertical PN junction 101 is formed on the bottom surface of the pocket layer 50.

As described above, according to the tunnel field effect transistor according to the first embodiment, because the source layer 40 is separated from the side surface of the pocket layer 50 by the sidewall insulating film 100a, the horizontal PN junction is not provided in the channel region. An upper surface of the second source layer 60, a side surface of the pocket layer 50 and an upper surface of the pocket layer 50 form a step shape as shown in FIG. 1. Accordingly, the tunnel field effect transistor according to the first embodiment can prevent generation of a tunnel current in the horizontal PN junction, thereby controlling its turning on and off by a tunnel current in the vertical PN junction 101. That is, an interface of the PN junction 101 is substantially perpendicular to a direction from the gate electrode 90 to the pocket layer 50. In other words, the PN junction 101 is substantially perpendicular to a direction of an electric field from the gate electrode 90 to the pocket layer 50. As a result, the S-factor can be improved.

The intrinsic region 70 is provided between the pocket layer 50 and the drain layer 30. Accordingly, even when a drain voltage is applied to the turned-off tunnel field effect transistor, an electric field is not applied to the vertical PN junction 101 and the pocket layer 50 and the drain layer 30 can be electrically separated from each other. Therefore, an off-leakage current can be suppressed.

Furthermore, the intrinsic region 70 is provided between the second source layer 60 and the drain layer 30. Accordingly, any high-purity PN junction is not formed between the second source layer 60 and the drain layer 30. Even when a drain voltage is applied, any strong reversed electric field is not applied to a PN junction between the second source layer 60 and the drain layer 30, so that a junction leakage current can be suppressed.

To turn on the tunnel field effect transistor according to the first embodiment, a positive voltage is applied to the gate electrode 90 and to the drain layer 30. Application of the positive voltage to the gate electrode 90 forms an inversion layer on surfaces (channel regions) of the pocket layer 50 and the intrinsic region 70. Therefore, the pocket layer 50 is electrically connected to the drain layer 30. Because the voltage applied to the gate electrode 90 applies an electric field to the vertical PN junction 101, a tunnel current flows between the pocket layer 50 and the second source layer 60. By applying the positive voltage to the drain layer 30, an electric field is applied to the vertical PN junction 101 and the tunnel current can flow from the drain layer 30 to the source layer 40 as shown by an arrow A in FIG. 1.

Figure 2A:
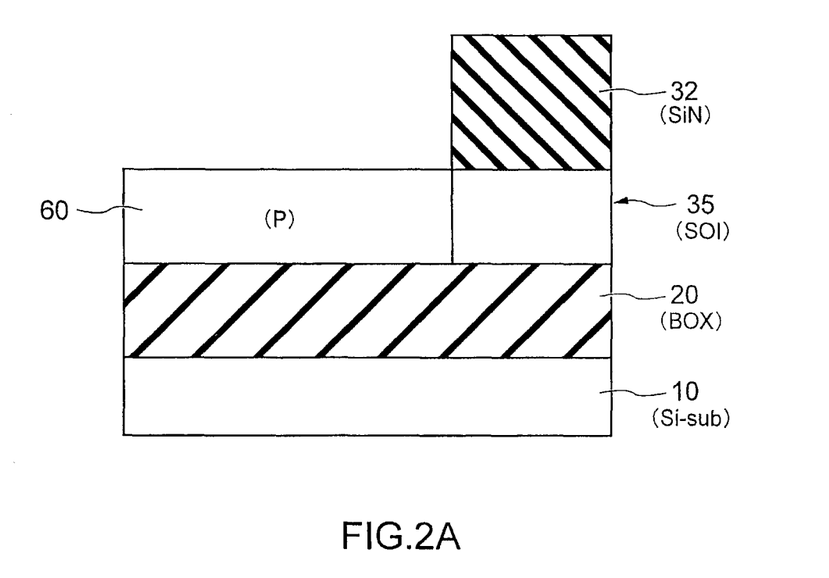

FIGS. 2A to 9 are cross-sectional views of a manufacturing method of a tunnel field effect transistor according to the first embodiment. A silicon nitride film 32 is deposited on the SOI layer 35 of an SOI substrate by a CVD (Chemical Vapor Deposition) method. The silicon nitride film 32 on the SOI layer 35 except for a formation region of the intrinsic region 70 and the drain layer 30 is then removed by using a lithography technique and an RIE (Reactive Ion Etch) method. A P-type impurity (such as boron) is ion-implanted by using the silicon nitride film 32 as a mask. With this process, as shown in FIG. 2A, the P-type second source layer 60 of the vertical PN junction 101 is formed.

Figure 2B:
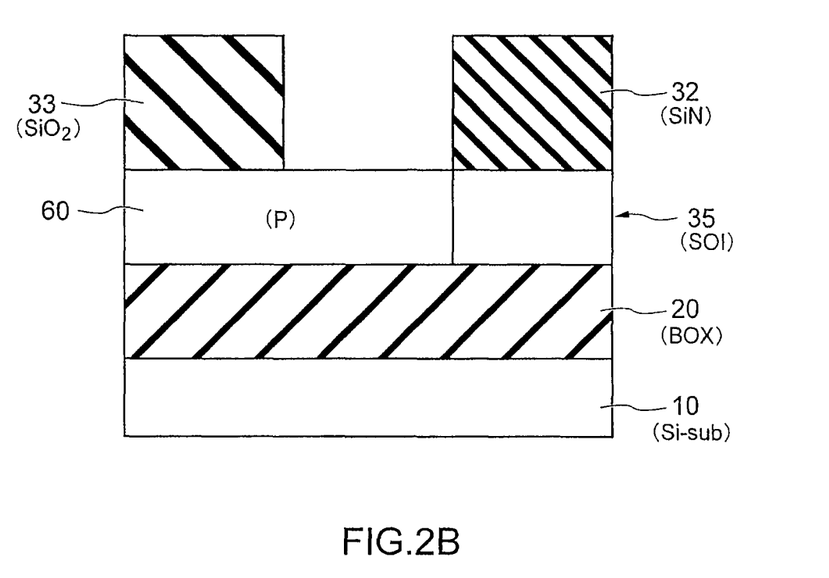

Next, a silicon oxide film 33 is deposited on the SOI layer 35 and the silicon nitride film 32 by using the CVD method. The silicon oxide film 33 is polished by a CMP (Chemical Mechanical Polishing) method until a surface of the silicon nitride film 32 is exposed. Further, the silicon oxide film 33 on the SOI layer 35 except for a formation region of the source layer 40 is removed by using the lithography technique and the RIE method. At this time, the silicon oxide film 33 is selectively processed so that the silicon nitride film 32 remains. Accordingly, the configuration shown in FIG. 2B is obtained.

Figure 3A:
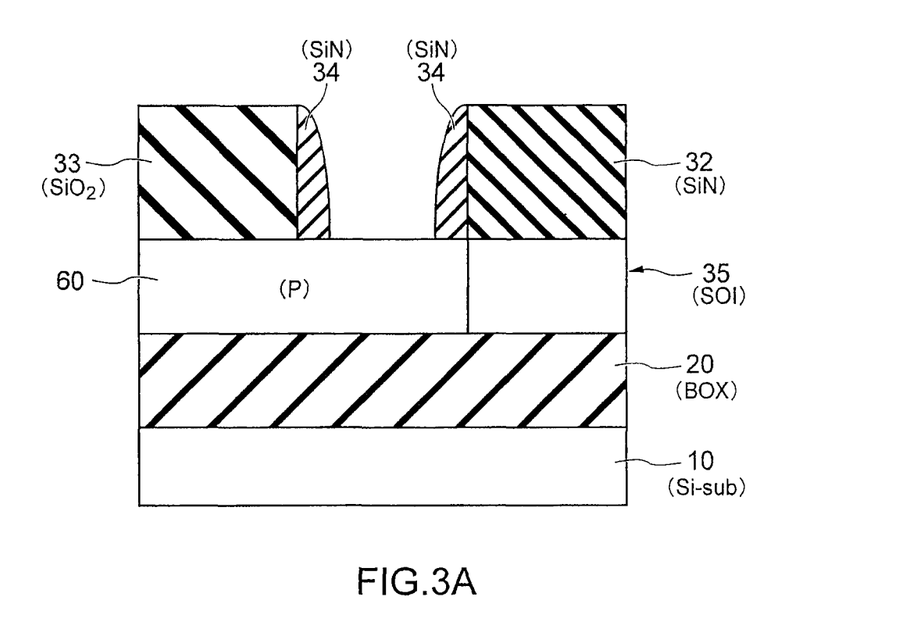

Next, a silicon nitride film 34 is deposited on the silicon nitride film 32, the silicon oxide film 33, and the SOI layer 35 (the second source layer 60) by using the CVD method. At this time, the silicon nitride film 34 is deposited to a thickness that does not completely bury a trench between the silicon nitride film 32 and the silicon oxide film 33. The silicon nitride film 34 is then anisotropically etched to remain on side surfaces of the silicon nitride film 32 and the silicon oxide film 33. Accordingly, the configuration shown in FIG. 3A is obtained. As explained later, the silicon nitride film 34 on a side of the silicon oxide film 33 becomes the sidewall insulating film 100a.

Figure 3B:
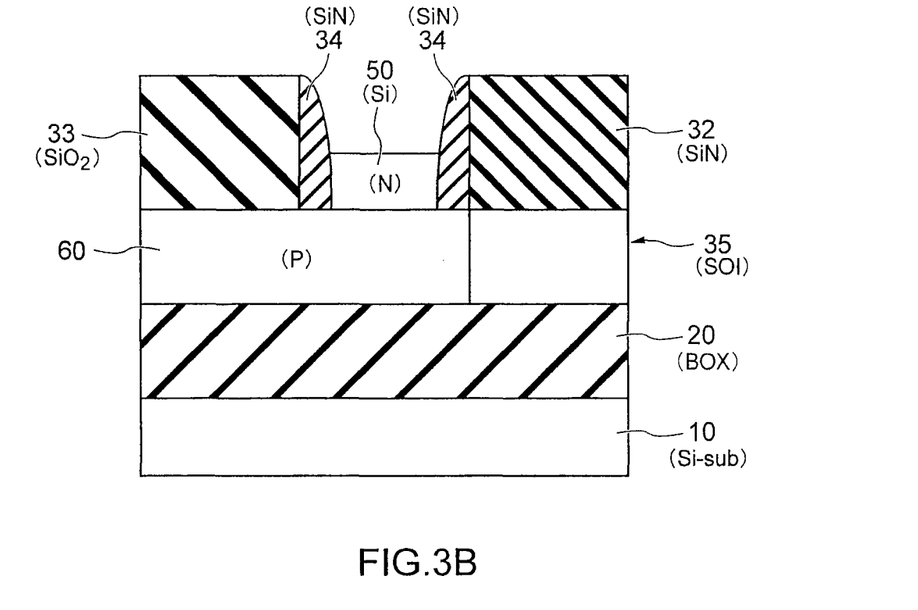

Next, as shown in FIG. 3B, by using an epitaxial growth method, a single crystal silicon that contains an N-type impurity is made to selectively grow in a region where the SOI layer 35 (the second source layer 60) is exposed. With this process, the pocket layer 50 is formed.

Figure 4A:
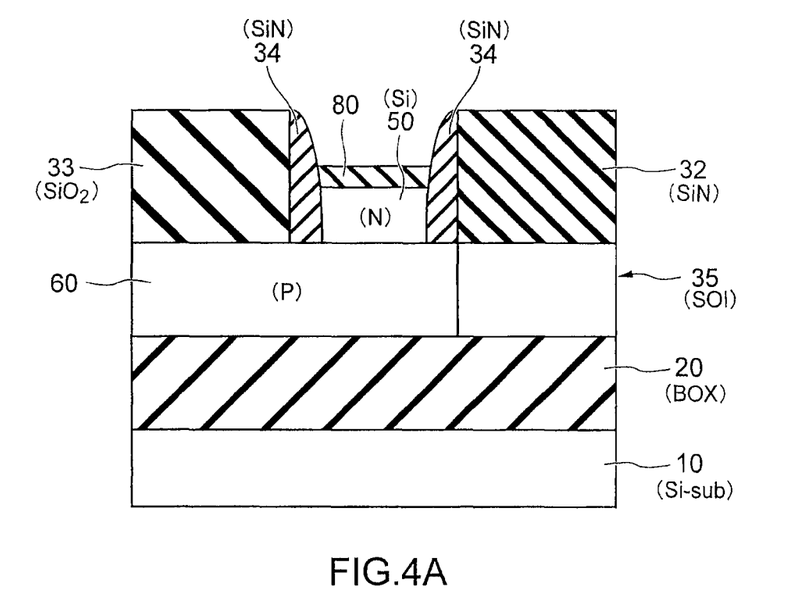

Next, as shown in FIG. 4A, the surface of the pocket layer 50 formed of a single crystal silicon is thermally oxidized, so that the gate insulating film 80 is formed on the surface of the pocket layer 50. The gate insulating film 80 can be formed of a material deposited by the CVD method (such as a silicon oxynitride film or a high-k film). In this case, the material for the gate insulating film 80 is deposited by the CVD method so as to be buried in the trench between the silicon nitride film 32 and the silicon oxide film 33, and then polished by the CMP method until the surfaces of the silicon nitride film 32 and the silicon oxide film 33 are exposed. Thereafter, the material for the gate insulating film 80 is etched to a desired height, so that the gate insulating film 80 is obtained.

Next, a silicon oxide film 37 is deposited on the silicon nitride film 32, the silicon oxide film 33, the silicon nitride film 34, and the gate insulating film 80 by using the CVD method.

Figure 4B:
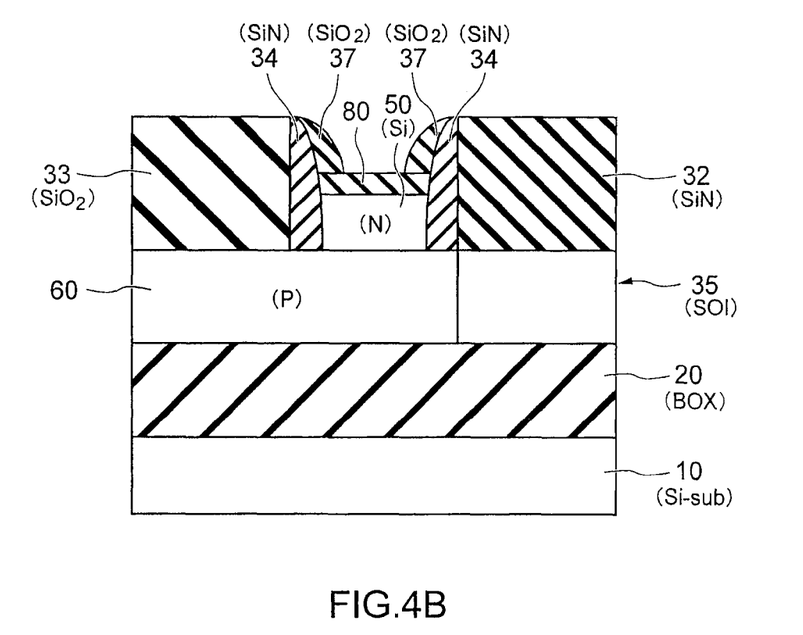

At this time, the silicon oxide film 37 is deposited to a thickness that does not completely bury a trench between the silicon nitride film 32 and the silicon oxide film 33. The silicon oxide film 37 is then anisotropically etched. With this process, the silicon oxide film 37 remains on the silicon nitride film 34 on the side surfaces of the silicon nitride film 32 and the silicon oxide film 33. Accordingly, the configuration shown in FIG. 4B is obtained.

Next, polysilicon that is a material for the gate electrode 90 is deposited by using the CVD method so as to bury the trench between the silicon nitride film 32 and the silicon oxide film 33. This polysilicon is polished by the CMP method until the surfaces of the silicon nitride film 32 and the silicon oxide film 33 are exposed. Alternatively, when the gate insulating film 80 is deposited by the CVD method, CMP is performed so as to polish upper part of the material of the gate insulating film 80, but not until the surfaces of the silicon nitride film 32 and the silicon oxide film 33 are exposed. Then, the polysilicon can be deposited by using the CVD method and polished by using the CMP method until the surfaces of the silicon nitride film 32 and the silicon oxide film 33 are exposed.

Figure 5A:
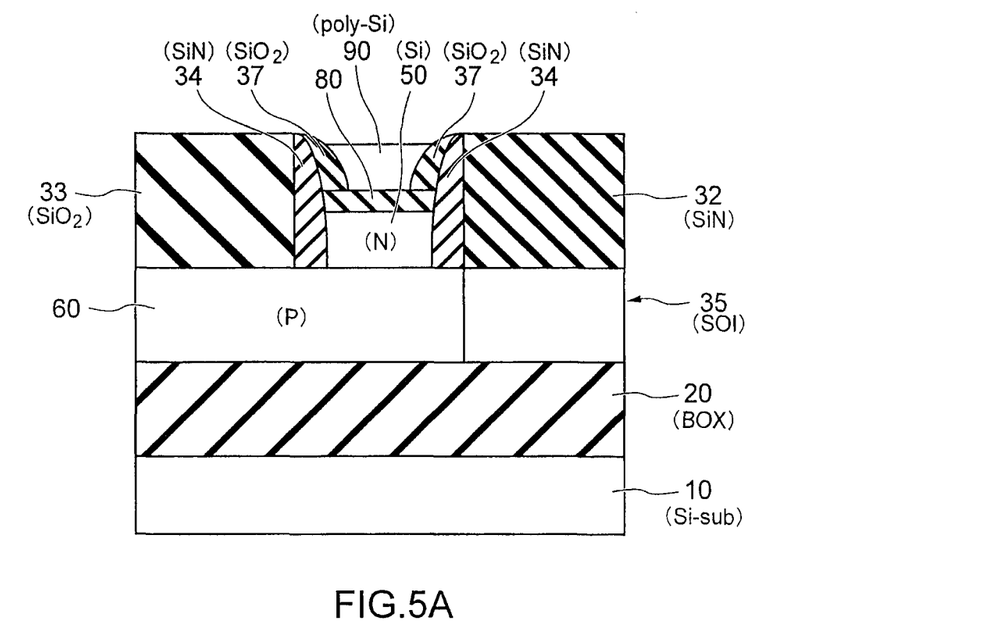

After an N-type impurity is ion-implanted to the polysilicon, a surface of the polysilicon is dry-etched so that the surface of the polysilicon is slightly lower than those of the silicon nitride film 32 and the silicon oxide film 33. Accordingly, as shown in FIG. 5A, the gate electrode 90 is obtained.

Figure 5B:
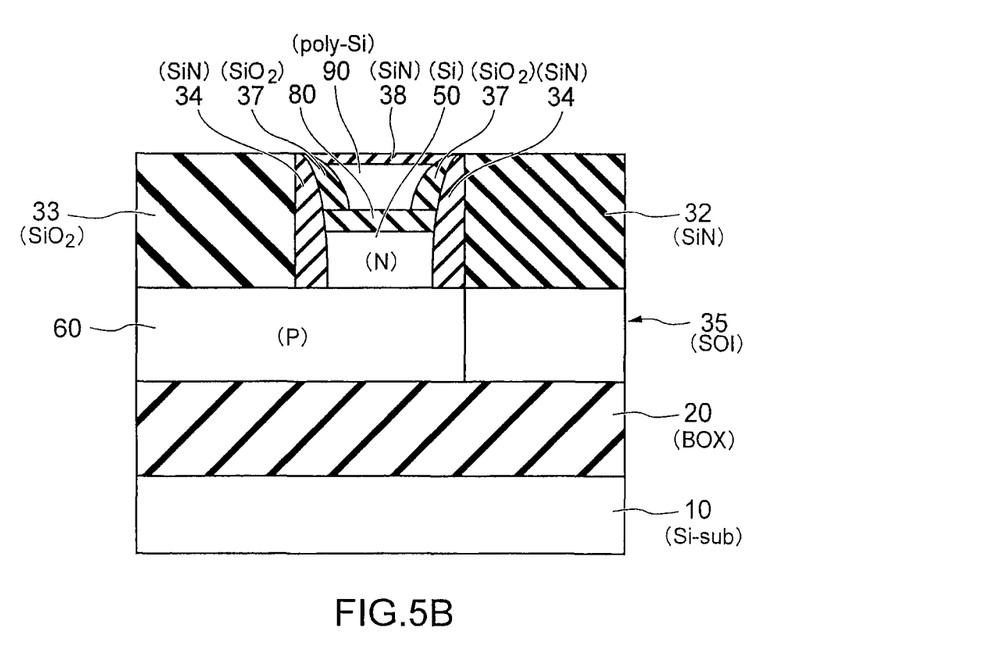

Next, a silicon nitride film 38 is deposited on the gate electrode 90 by the CVD method and polished by the CMP method until top surfaces of the silicon nitride film 32 and the silicon oxide film 33 are exposed. Consequently, as shown in FIG. 5B, the silicon nitride film 38 is formed so as to cover a surface of the gate electrode 90.

Figure 6A:
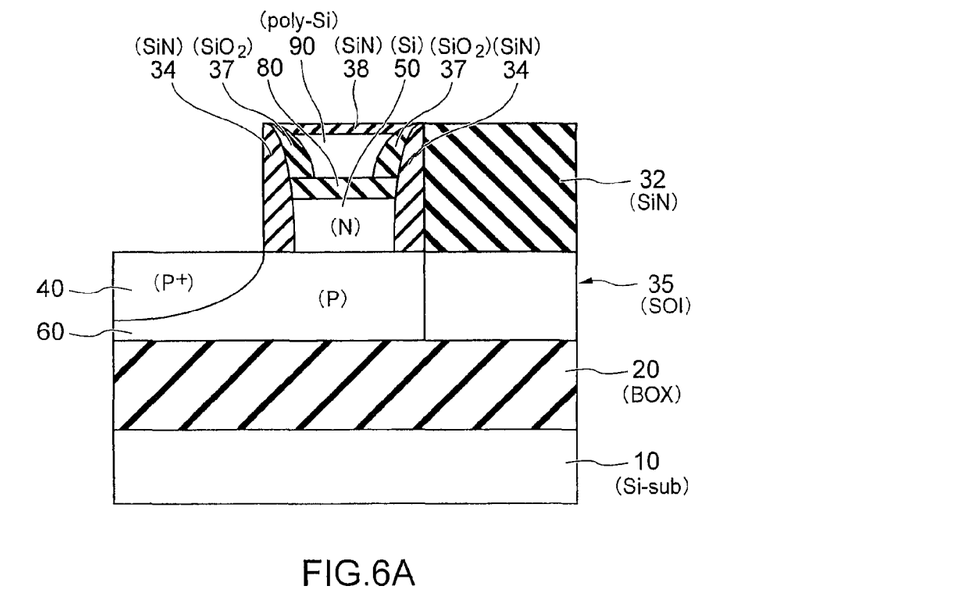

Next, as shown in FIG. 6A, the silicon oxide film 33 is removed by wet etching. At this time, the silicon nitride films 32, 34, and 38 protect the silicon oxide film 37, the gate electrode 90, the gate insulating film 80, and the pocket layer 50. Accordingly, only the silicon oxide film 33 is selectively removed. A P-type impurity (such as boron) is introduced in the SOI layer 35 (the second source layer 60) by using the silicon nitride films 32, 34, and 38 as a mask. With this process, the P+ type source layer 40 shown in FIG. 6A is formed.

Figure 6B:
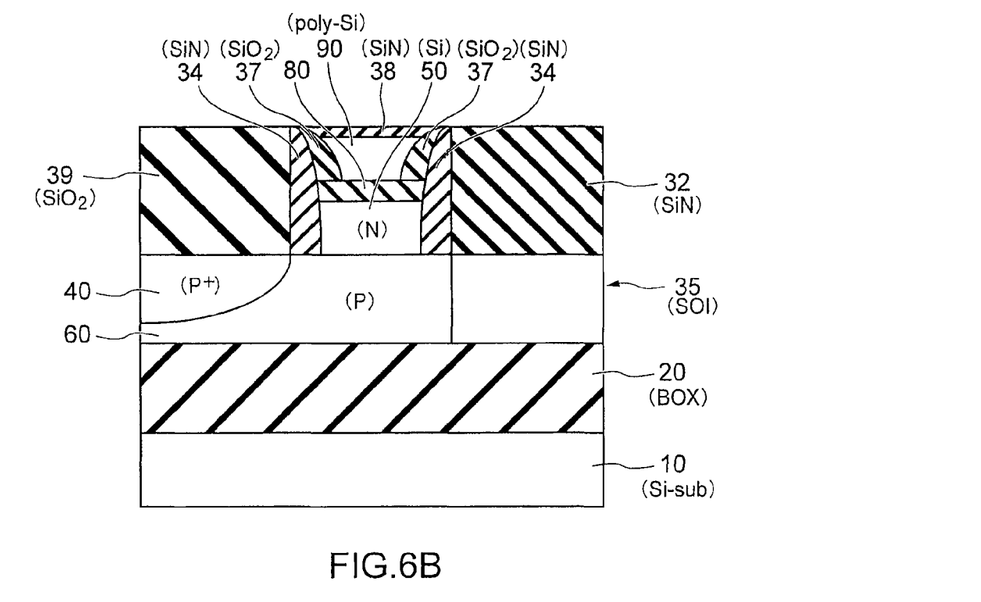

Next, a silicon oxide film 39 is deposited on the source layer 40 and the silicon nitride films 32 and 38 by using the CVD method. The silicon oxide film 39 is then polished by using the CMP method until the surfaces of the silicon nitride films 32 and 38 are exposed. With this process, as shown in FIG. 6B, the silicon oxide film 39 that covers the source layer 40 is formed.

Figure 7A:
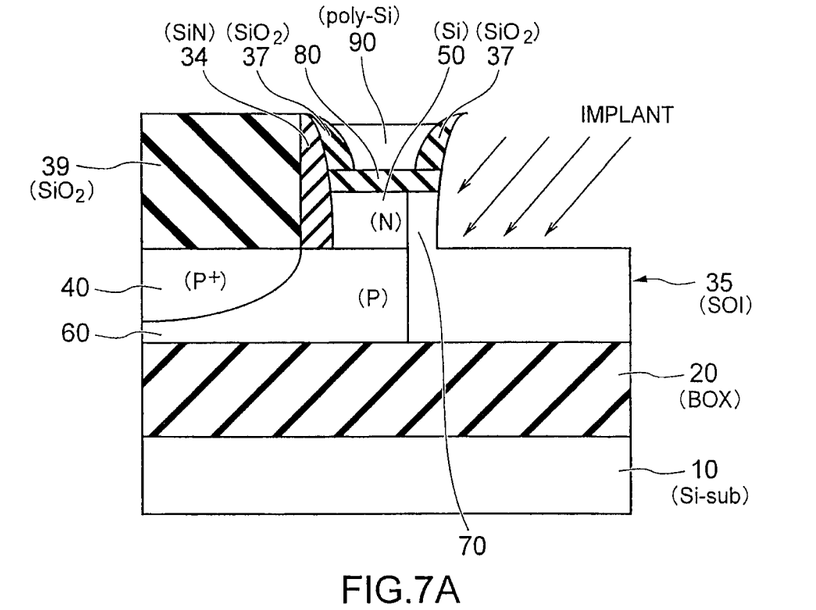

Next, the silicon nitride films 32 and 38 and the silicon nitride film 34 on the drain side are removed by wet etching by using the silicon oxide film 39 as a mask. A P-type impurity (such as boron) is then introduced in a tiltied direction from a region where the drain layer 30 is formed to the channel region (in the direction of arrows in FIG. 7A). The concentration of the introduced P-type impurity is the same as that of the N-type impurity of the pocket layer 50. A part of the N-type pocket layer 50 on a side of the drain layer 30 becomes an intrinsic semiconductor region. The impurity concentration of the intrinsic semiconductor region is equal to or less than $10^{18}$ cm$^{-3}$. This intrinsic semiconductor region becomes the intrinsic region 70 as shown in FIG. 7A.

Figure 7B:
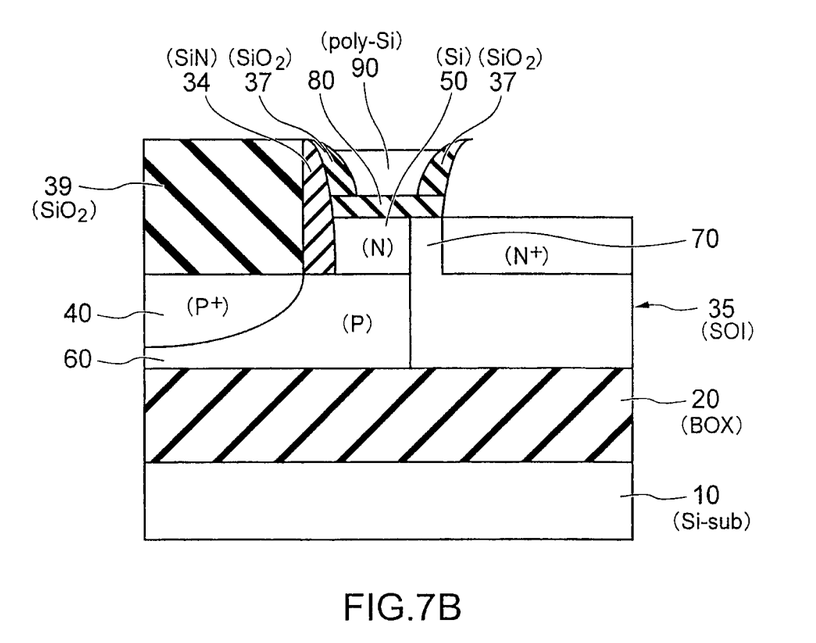

Next, as shown in FIG. 7B, a single crystal silicon that contains an N-type impurity (such as phosphorus or arsenic) is made to grow on the SOI layer 35 by the epitaxial growth method.

Figure 8A:
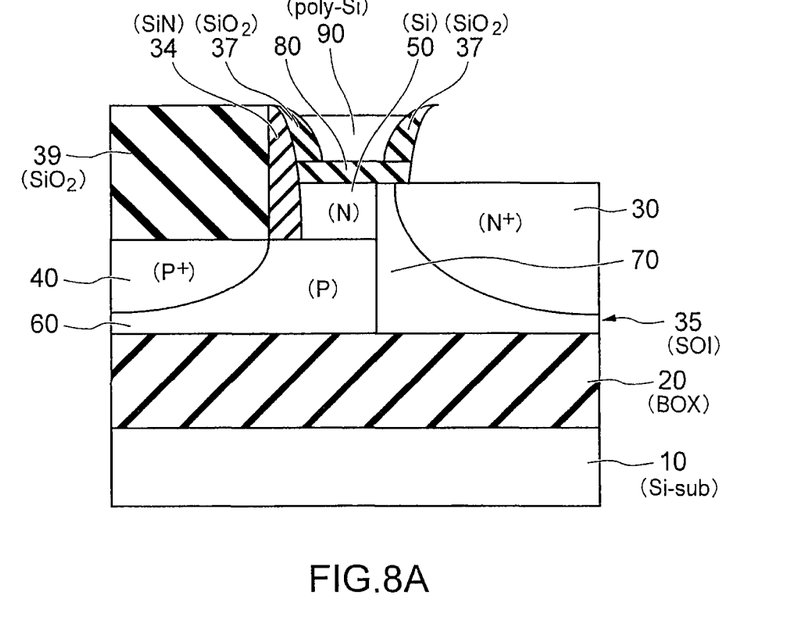

The N-type impurity (such as phosphorus or arsenic) is further introduced in the SOI layer 35 by using the silicon oxide films 39 and 37 and the gate electrode 90 as a mask. With this process, as shown in FIG. 8A, the N+ type drain layer 30 is formed.

Figure 8B:
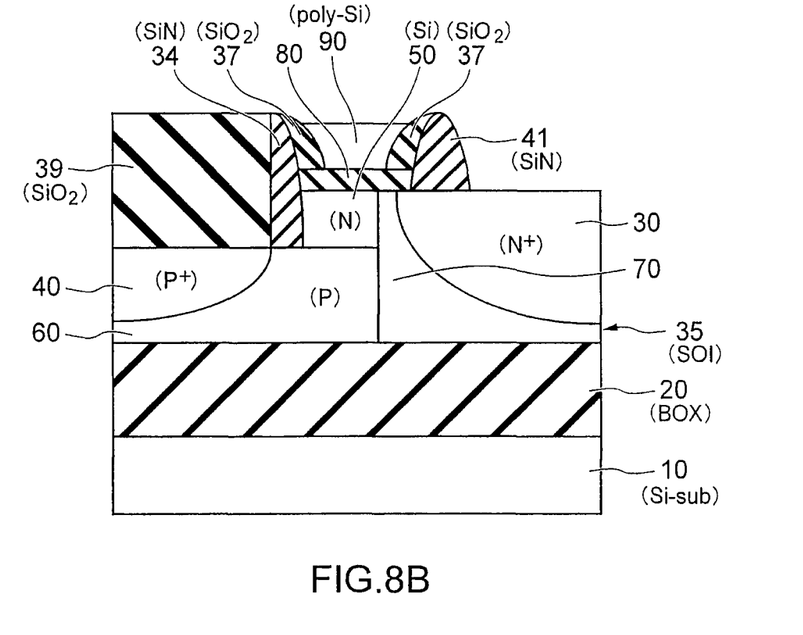

Next, a silicon nitride film 41 is deposited on the drain layer 30, the gate electrode 90, and the silicon oxide film 39 by the CVD method. The silicon nitride film 41 is then anisotropically etched by the RIE method. Consequently, as shown in FIG. 8B, the silicon nitride film 41 that covers the silicon oxide film 37 on a side surface of the gate electrode 90 on the drain side and the side surface of the gate insulating film 80 is formed. As explained later, the silicon nitride film 41 functions as the sidewall insulating film 100b.

Figure 9:
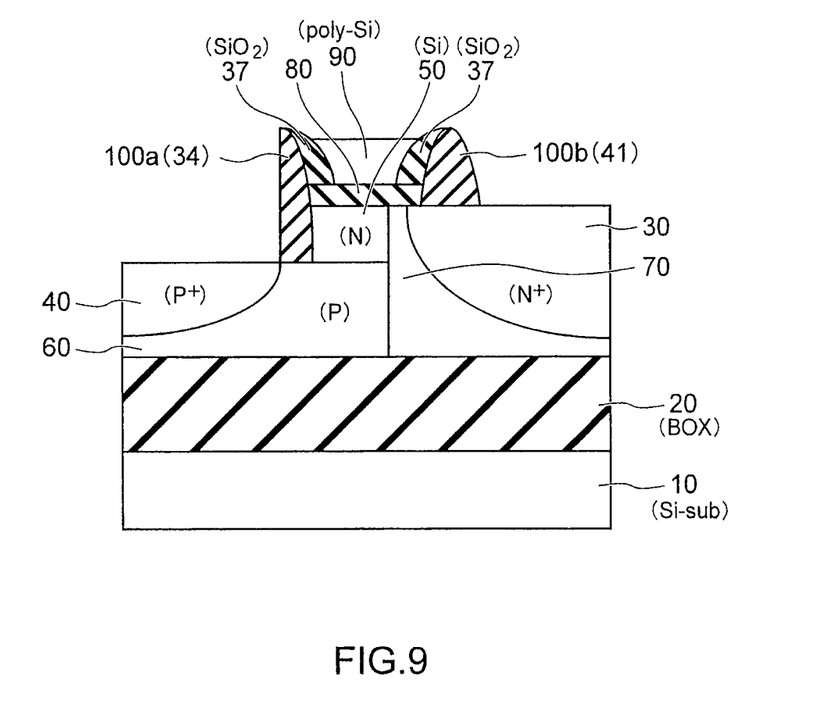

Furthermore, the silicon oxide film 39 is selectively removed by wet etching, so that the configuration shown in FIG. 9 is obtained. As shown in FIG. 9, the silicon nitride film 34 functions as the sidewall insulating film 100a and the silicon nitride film 41 functions as the sidewall insulating film 100b. Thereafter, by known processing, interlayer insulating films, contacts, and wiring are formed. In this manner, a tunnel field effect transistor is completed. The configuration shown in FIG. 9 is slightly different from that of FIG. 1, but these configurations are identical in operations and functions thereof.

The tunnel field effect transistor according to the first embodiment includes a vertical PN junction between the pocket layer 50 and the second source layer 60. However, because the source layer 40 is separated from the pocket layer 50 by the sidewall insulating film 100a, the channel region does not include any horizontal PN junction. Accordingly, generation of a tunnel current in the horizontal PN junction can be prevented and the transistor can be reliably turned on and off by a tunnel current in the vertical PN junction 101. This leads to an improvement in the S-factor.

The intrinsic region 70 is provided between the pocket layer 50 and the drain layer 30. Accordingly, a leakage current (an off-leakage current) flowing between the source and the drain when the tunnel field effect transistor is turned off can be suppressed.

The intrinsic region 70 is also provided between the second source layer 60 and the drain layer 30. Therefore, a junction leakage current between the second source layer 60 and the drain layer 30 can be also suppressed.

(Modification of First Embodiment)

In the first embodiment, tilted ion implantation is performed in the process of FIG. 7A. In a modification of the first embodiment, the tunnel field effect transistor of the first embodiment is formed without performing tilted ion implantation.

Figure 10A:
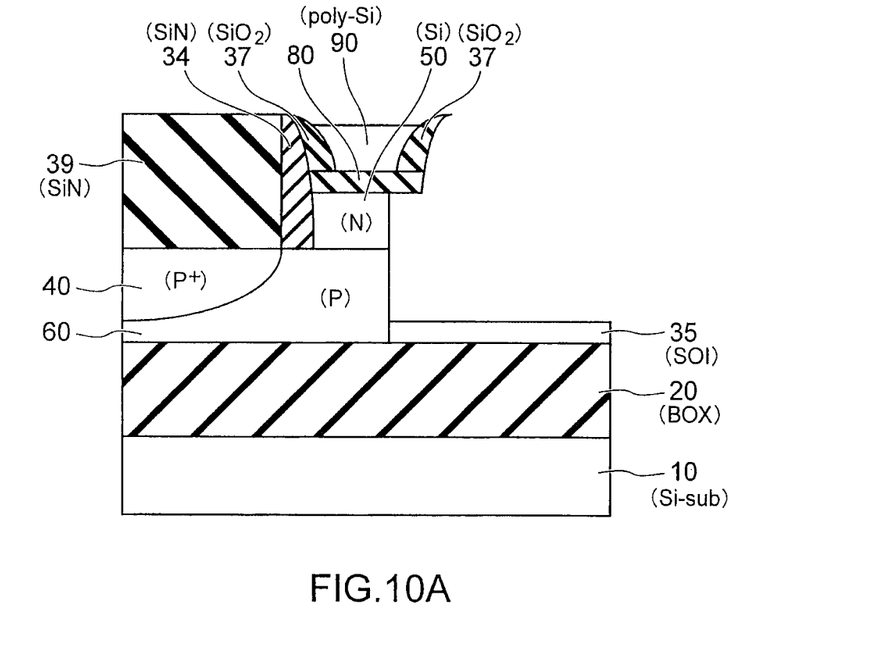
FIGS. 10A and 10B are cross-sectional views of a manufacturing method of a tunnel field effect transistor according to a modification of the first embodiment.

After performing the processes explained with reference to FIGS. 2A to 6B, the silicon nitride films 32, 34, and 38 are removed by wet etching. A part of the SOI layer 35 is then etched by a CDE (Chemical Dry Etching) method. At this time, parts of the pocket layer 50 and the second source layer 60 are horizontally etched. As shown in FIG. 10A, parts of the pocket layer 50 and the second source layer 60 immediately below the gate insulating film 80 are removed.

Figure 10B:
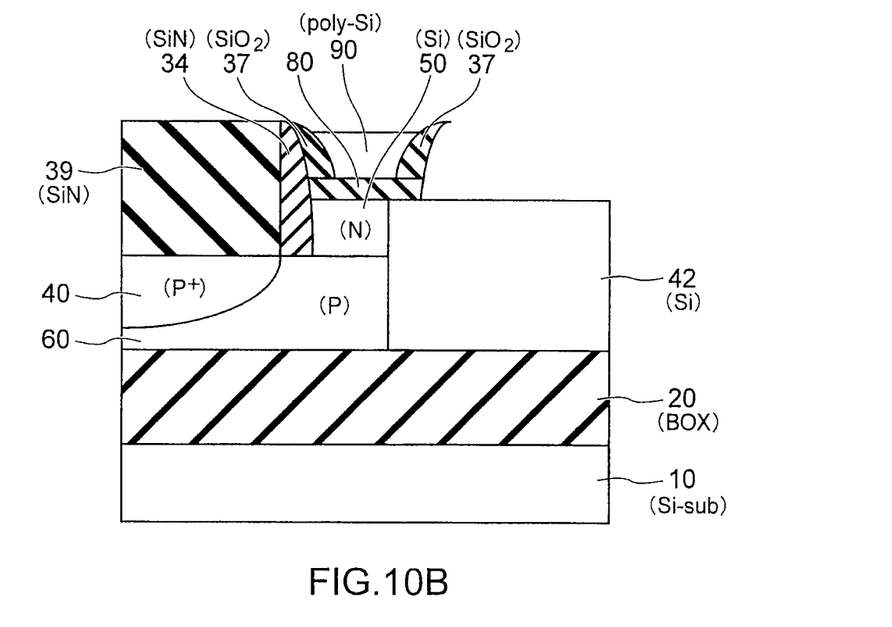

Next, a single crystal silicon is grown in a formation region of the drain layer 30 and the intrinsic region 70, by the epitaxial growth method by using the SOI layer 35 remaining on the BOX layer 20 as a seed. With this process, as shown in FIG. 10B, a single-crystal silicon layer 42 is formed in the formation region of the drain layer 30 and the intrinsic region 70. The single-crystal silicon layer 42 is an intrinsic semiconductor region and its impurity concentration is equal to or less than $10^{18}$ cm$^{-3}$.

Thereafter, as explained with reference to FIG. 8A, an N-type impurity (such as phosphorus or arsenic) is introduced in the single-crystal silicon layer 42 by using the silicon oxide films 39 and 37 and the gate electrode 90 as a mask. At this time, ion implantation is performed in a direction vertical to the surface of the SOI layer 35 without performing tilted ion implantation. With this process, as shown in FIG. 8A, the N+ type drain layer 30 is formed.

By the processes explained with reference to FIGS. 8B to 9, a tunnel field effect transistor is completed.

In the present modification, the tunnel field effect transistor according to the first embodiment can be formed without performing tilted ion implantation. This modification can achieve effects identical to those of the first embodiment.
(Second Embodiment)

Figure 11:
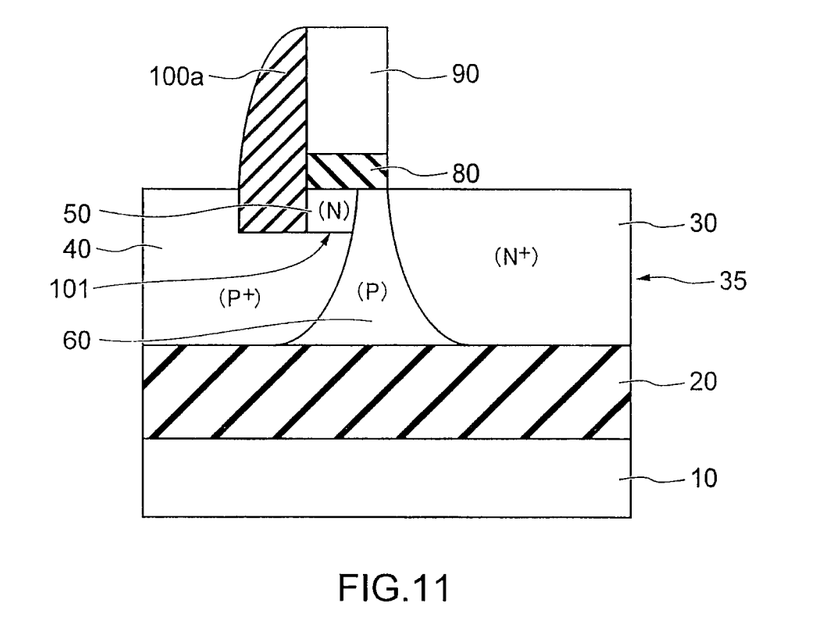
FIG. 11 is a cross-sectional view of a configuration of a tunnel field effect transistor according to a second embodiment.

FIG. 11 is a cross-sectional view of a configuration of a tunnel field effect transistor according to a second embodiment.

The second embodiment is different from the first embodiment in that the intrinsic region 70 is not provided. Furthermore, according to the second embodiment, the source layer 40 is provided below the pocket layer 50 in the SOI layer 35 and contacts the bottom of the pocket layer 50 in a direction substantially vertical to the surface of the SOI layer 35.

With this configuration, the source layer 40 and the bottom of the pocket layer 50 constitute a vertical PN junction.

That is, in the second embodiment, the source layer 40 constitutes the vertical PN junction with the pocket layer 50 instead of the second source layer 60. Other configurations of the second embodiment can be identical to the corresponding ones described in the first embodiment.

According to the second embodiment, the sidewall insulating film 100a separates the source layer 40 from the side surface of the pocket layer 50 as in the first embodiment. Accordingly, while a vertical PN junction is provided between the source layer 40 and the bottom surface of the pocket layer 50, any horizontal PN junction is not provided in the second embodiment. Therefore, according to the second embodiment, generation of a tunnel current in the horizontal PN junction can be prevented and a tunnel current in the vertical PN junction 101 can turn on and off the transistor as in the first embodiment.

A method of manufacturing a tunnel field effect transistor according to the second embodiment is obtained by omitting the process of forming the intrinsic region 70 and changing the process of forming the source layer 40 in the method of manufacturing a tunnel field effect transistor according to the first embodiment.

Specifically, in the process explained with reference to FIG. 2A, a P-type impurity is introduced by using the silicon nitride film 32 as a mask, so that the second source layer 60 is formed.

After performing the processes explained with reference to FIGS. 2B to 5B, the amount of P-type impurity implanted in the formation region of the source layer 40 is increased as shown in FIG. 6A for extending the diffusion time of the source layer 40. Alternatively, the P-type impurity can be introduced obliquely from the formation region of the source layer 40 toward the channel region.

After performing the process explained with reference to FIG. 6B, the tilted ion-implantation process explained with reference to FIG. 7A is omitted and the processes explained with reference to FIGS. 7B to 9 are performed. Accordingly, the tunnel field effect transistor according to the second embodiment can be formed.
(Third Embodiment)

Figure 12:
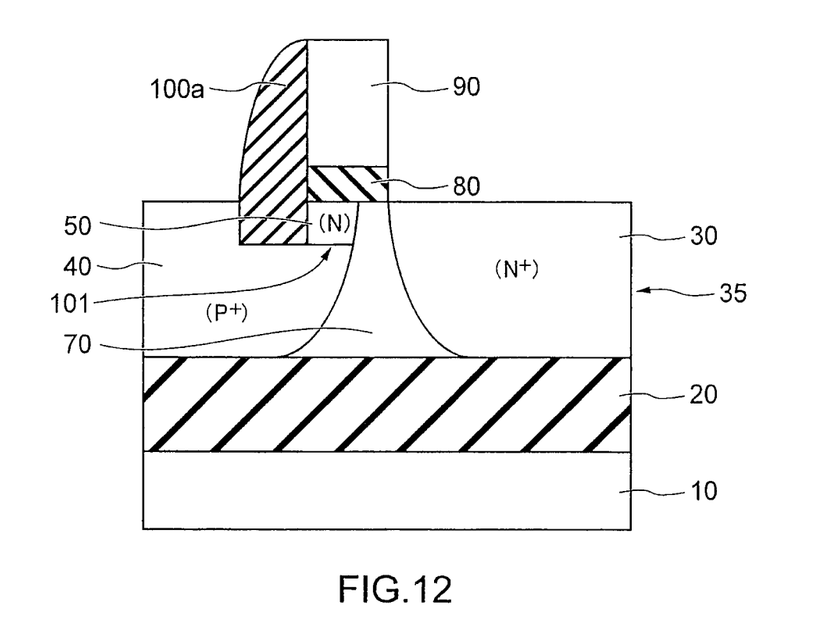
FIG. 12 is a cross-sectional view of a configuration of a tunnel field effect transistor according to a third embodiment.

FIG. 12 is a cross-sectional view of a configuration of a tunnel field effect transistor according to a third embodiment.

The third embodiment is different from the first embodiment in that the second source layer 60 is not provided. According to the third embodiment, the source layer 40 is provided on the bottom surface of the pocket layer 50. The source layer 40 and the pocket layer 50 constitute the vertical PN junction 101. Other configurations of the third embodiment can be identical to the corresponding ones described in the first embodiment.

According to the third embodiment, the intrinsic region 70 is provided between the source layer 40 and the drain layer 30 and between the pocket region 50 and the drain layer 30. The intrinsic region 70 is an intrinsic semiconductor region and has an impurity concentration equal to or less than $10^{18}$ cm$^{-3}$.

According to the third embodiment, the sidewall insulating film 100a separates the source layer 40 from the side surface of the pocket layer 50 as in the first embodiment.

Accordingly, while a vertical PN junction is provided between the source layer 40 and the bottom surface of the pocket layer 50, any horizontal PN junction is not provided in the third embodiment. According to the third embodiment, generation of a tunnel current in the horizontal PN junction can be prevented and a tunnel current in the vertical PN junction 101 can turn on and off the transistor as in the first embodiment.

A method of manufacturing a tunnel field effect transistor according to the third embodiment is obtained by omitting the process of forming the second source layer 60 in the method of manufacturing a tunnel field effect transistor according to the first embodiment and changing the process of forming the source layer 40 as in the second embodiment.

Specifically, in the process explained with reference to FIG. 2A, any P-type impurity is not introduced in the SOI layer 35. Accordingly, the SOI layer 35 is maintained to be an intrinsic semiconductor region. The silicon nitride film 32 has to be formed in this case.

After performing the processes explained with reference to FIGS. 2B to 5B, the amount of P-type impurity implanted in the formation region of the source layer 40 is increased as shown in FIG. 6A for extending the diffusion time of the source layer 40. Alternatively, the P-type impurity can be introduced obliquely from the formation region of the source layer 40 toward the channel region.

Because the SOI layer 35 is maintained to be the intrinsic semiconductor region (because the second source layer 60 is not formed), the tilted ion-implantation process explained with reference to FIG. 7A is not required. After performing the process explained with reference to FIG. 6B, the tilted ion-implantation process explained with reference to FIG. 7A is omitted. The processes explained with reference to FIGS. 7B to 9 are then performed. Accordingly, the tunnel field effect transistor according to the third embodiment can be formed.

The first to third embodiments have explained an embodiment of using an N-type tunnel field effect transistor.

However, the first to third embodiments can be also applicable for a P-type tunnel field effect transistor. In this case, in the respective constituent elements of the first to third embodiments, it suffices that an N-type semiconductor is used instead of a P-type semiconductor, a P-type semiconductor is used instead of an N-type semiconductor, an N-type impurities are used instead of P-type impurities, and P-type impurities are used instead of N-type impurities.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a semiconductor layer;
   a gate insulating film above the semiconductor layer;
   a gate electrode on the gate insulating film;
   a first channel region of a first conductivity type provided on a part of a surface of the semiconductor layer below the gate insulating film;
   a diffusion layer of a second conductivity type different from the first conductivity type provided below the first channel region in the semiconductor layer, the diffusion layer contacting a bottom of the first channel region in a direction substantially perpendicular to a surface of the semiconductor layer, and forming a PN junction with the bottom of the first channel region;
   a drain of a first conductivity type provided on a side of the first channel region in the semiconductor layer;
   a source of a second conductivity type provided on another side of the first channel region in the semiconductor layer;
   a sidewall insulating film covering a side surface of the first channel region on a side of the diffusion layer, the side surface of the first channel region extending from a top surface to the bottom thereof; and
   a second channel region provided between the first channel region and the drain and provided on another part of the surface of the semiconductor layer below the gate insulating film, the second channel region having an impurity concentration equal to or less than $10^{18}$ cm$^{-3}$.

2. The device of claim 1, wherein the sidewall insulating film is interposed between a side surface of the first channel region on a side of the source and the source.

3. The device of claim 1, wherein the second channel region is provided between the diffusion layer of a second conductivity type and the drain.

4. The device of claim 3, wherein the sidewall insulating film is provided so that the diffusion layer or the source does not contact a side of the first channel region.

5. The device of claim 2, wherein the second channel region is provided between the diffusion layer of a second conductivity type and the drain.

6. The device of claim 1, wherein the source is the diffusion layer.

7. The device of claim 1, wherein the sidewall insulating film is provided so that the diffusion layer or the source does not contact a side of the first channel region.

8. The device of claim 1, wherein an interface between the gate insulating film and the first channel region is provided in a higher position than a bottom of the sidewall insulating film.

9. The device of claim 1, wherein an upper surface of the diffusion layer, the side surface of the first channel region and an upper surface of the first channel region form a step shape.

10. The device of claim 1, wherein the PN junction is substantially perpendicular to a direction from the gate electrode to the first channel region.

11. The device of claim 1, wherein the PN junction is substantially perpendicular to a direction of an electric field from the gate electrode to the first channel region.

12. The device of claim 1, wherein the sidewall insulating film directly contacts with the side surface of the first channel region.

13. A semiconductor device comprising:
    a semiconductor layer;
    a gate insulating film above the semiconductor layer;
    a gate electrode on the gate insulating film;
    a first channel region of a first conductivity type provided on a part of a surface of the semiconductor layer below the gate insulating film;
    a drain in the semiconductor layer on a side of the first channel region;
    a diffusion layer of a second conductivity type provided below the first channel region in the semiconductor layer, the diffusion layer contacting a bottom of the first channel region in a direction substantially perpendicular to a surface of the semiconductor layer, and forming a PN junction with the bottom of the first channel region;
    a second channel region provided between the diffusion layer and the drain region and provided on another part of the surface of the semiconductor layer below the gate insulating film, the second channel region having an impurity concentration equal to or less than $10^{18}$ cm$^{-3}$; and
    a sidewall insulating film provided on a side surface of the first channel region so that the diffusion layer does not contact a side of the first channel region, the side surface of the first channel region extending from a top surface to the bottom thereof.

14. The device of claim 13, wherein the sidewall insulating film directly contacts with the side surface of the first channel region.

15. A semiconductor device comprising:
    a semiconductor layer;
    a gate insulating film above the semiconductor layer;
    a gate electrode on the gate insulating film;
    a first channel region of a first conductivity type provided on a part of a surface of the semiconductor layer below the gate insulating film;
    a drain in the semiconductor layer on a side of the first channel region;
    a diffusion layer of a second conductivity type provided below the first channel region in the semiconductor layer, the diffusion layer contacting a bottom of the first channel region in a direction substantially perpendicular to a surface of the semiconductor layer, and forming a PN junction with the bottom of the first channel region;
    a second channel region provided between the first channel region of a first conductivity type and the drain region and provided on another part of the surface of the semiconductor layer below the gate insulating film, the second channel region having an impurity concentration equal to or less than $10^{18}$ cm$^{-3}$; and
    a sidewall insulating film provided on a side surface of the first channel region so that the diffusion layer does not contact a side of the first channel region, the side surface of the first channel region extending from a top surface to the bottom thereof.

16. The device of claim 15, wherein the sidewall insulating film directly contacts with the side surface of the first channel region.

\* \* \* \* \*